(12) United States Patent
Segervall

(10) Patent No.: US 6,621,679 B1
(45) Date of Patent: Sep. 16, 2003

(54) 5V TOLERANT CORNER CLAMP WITH KEEP OFF CIRCUIT

(75) Inventor: Alan Erik Segervall, Half Moon Bay, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 112 days.

(21) Appl. No.: 10/006,602

(22) Filed: Dec. 5, 2001

(51) Int. Cl.[7] .................................. H05K 5/00
(52) U.S. Cl. ...................................... 361/111
(58) Field of Search ................. 361/111, 760, 361/772, 54, 56; 257/678, 690, 691, 692

(56) References Cited

U.S. PATENT DOCUMENTS

| | | | |
|---|---|---|---|
| 5,239,440 A | 8/1993 | Merrill | 361/56 |
| 5,838,146 A * | 11/1998 | Singer | 361/56 |
| 6,104,588 A | 8/2000 | Hariton et al. | 361/111 |
| 6,400,540 B1 * | 6/2002 | Chang | 361/56 |
| 6,538,868 B2 * | 3/2003 | Chang et al. | 361/111 |

* cited by examiner

Primary Examiner—Edward H. Tso
Assistant Examiner—Pia Tibbits
(74) Attorney, Agent, or Firm—Mark C. Pickering

(57) ABSTRACT

An electrostatic discharge (ESD) corner clamp is connected to a positive ESD rail that has a steady first voltage, such as 2.6V, and can be driven to a larger second voltage, such as 4.3V. The ESD corner clamp provides 5V tolerance by utilizing a keep off circuit that prevents the corner clamp from triggering when the voltage on the positive ESD rail changes from the first voltage to the second voltage.

18 Claims, 6 Drawing Sheets

5V TOLERANT CORNER CLAMP WITH KEEP OFF CIRCUIT

BACKGROUND OF THE INVENTION

1. Field of the Invention

The present invention relates to a corner clamp and, more particularly, to a 5V tolerant corner clamp with a keep off circuit.

2. Description of the Related Art

An electrostatic discharge (ESD) protection circuit is a circuit that protects the input/output transistors of a semiconductor chip from an ESD event. An ESD event typically occurs when the chip is exposed to static electricity, such as when the pins or solder bumps of the chip are touched by an ungrounded person handling the chip, or when the chip slides across another surface on its pins or solder bumps.

For example, an ungrounded person handling a semiconductor chip can place a static electric charge as high as 2000V on the chip. This voltage is more than sufficient to destructively break down the gate oxide of the input/output transistors of the chip.

FIG. 1 shows a schematic diagram that illustrates a prior-art ESD protection circuit 100. As shown in FIG. 1, circuit 100 includes an ESD plus ring 110 and an ESD minus ring 112 that are formed around the periphery of a semiconductor die 114. In addition, circuit 100 includes a power pad 120, a ground pad 122, and a number of input/output (I/O) pads 124.

As further shown in FIG. 1, circuit 100 includes a plurality of upper diodes D1 that are connected to ESD plus ring 110 and the pads 120, 122, and 124 so that each pad is connected to ESD plus ring 110 via a diode D1. In addition, a plurality of lower diodes D2 are connected to ESD minus ring 112 and the pads 120, 122, and 124 so that each pad is connected to ESD minus ring 112 via a diode D2. Circuit 100 also includes four corner clamps 130 that are connected to ESD plus ring 110 and ESD minus ring 112.

In operation, when an ESD event occurs, a first pad, such as pad A, is zapped positively with respect to a second pad, such as pad B. In this situation, a zap current $I_{ZAP}$ flows from the first pad through the adjacent diode D1 to ESD plus ring 110, and then on to corner clamps 130.

Corner clamps 130 are voltage controlled switches that each provide a low impedance pathway from ESD positive ring 110 to ESD negative ring 112 when an ESD event is present, and a high impedance pathway between rings 110 and 112 when an ESD event is not present.

When the first pad is zapped, the corner clamps 130 (which are shown open, not closed, in FIG. 1) close and the zap current $I_{ZAP}$ flows through clamps 130 to ESD minus ring 112. From ring 112, the zap current $I_{ZAP}$ flows through a diode D2 and on to the second pad.

FIG. 2 shows a schematic diagram that illustrates corner clamp 130. As shown in FIG. 2, clamp 130 includes a RC timing circuit 210, an inverter 212, and a switching transistor M1. Timing circuit 210, in turn, includes a resistor R that is connected to ESD plus ring 110, and a capacitor C that is connected to resistor R and ESD minus ring 112.

Inverter 212 includes a PMOS transistor M2 and a NMOS transistor M3. Transistor M2 has a source connected to ESD plus ring 110, a gate connected to resistor R and capacitor C, and a drain. Transistor M3 has a source connected to ESD minus ring 112, a gate connected to resistor R and capacitor C, and a drain connected to the drain of transistor M2.

Further, switching transistor M1 has a source connected to ESD minus ring 112, a gate connected to the drains of transistors M2 and M3, and a drain connected to ESD plus ring 110.

In operation, when an ESD event occurs and the zap current $I_{ZAP}$ flows onto ESD plus ring 110, the voltage on ESD plus ring 110 spikes up dramatically. The voltage on the gates of transistors M2 and M3 also spikes up but, due to the presence of RC timing circuit 110, the gate voltage lags the voltage on ESD plus ring 110.

As a result, the gate-to-source voltage of transistor M2 falls below the threshold voltage of transistor M2, thereby turning on transistor M2 for as long as the gate voltage lags the voltage on ring 110. When transistor M2 turns on, transistor M2 pulls up the voltage on the gate of transistor M1, thereby turning on transistor M1. When transistor M1 is turned on, clamp 130 provides a low impedance pathway from ESD plus ring 110 to ESD minus ring 112.

Once the packaged integrated circuit has been attached to a circuit board, power has been applied to the integrated circuit, and a steady state condition has been reached, a first voltage is present on both ESD plus ring 110 and the gates of transistors M2 and M3. For example, when pad 120 is a 3.3V power pad, a first voltage of 2.6V is present on ESD plus ring 110 due to the diode drop of adjacent diode D1. In addition, a second voltage is present on ESD minus ring 112. For example, since pad 122 is ground, a second voltage of 0.7V is present on ESD minus ring 112 due to the diode drop of adjacent diode D2.

Since the first voltage is present on the gates of transistors M2 and M3, transistor M2 is turned off and transistor M3 is turned on. When turned on, transistor M3 pulls down the voltage on the gate of transistor M1, thereby turning off transistor M1. When transistor M1 is turned off, clamp 130 provides a high impedance pathway from ESD plus ring 110 to ESD minus ring 112.

One problem with clamp 130 is that clamp 130 falsely triggers when used with a 5V tolerant circuit. A 5V tolerant circuit is a circuit that internally utilizes a voltage less than 5V, such as 3.3V, but receives 5V signals. For example, I/O pad C in FIG. 1 can be driven by an external driver that outputs signals ranging from zero to 5V.

When 5V signals are driven onto a signal pad, such as pad C, the voltage on ESD plus ring 110 spikes up from 2.6V to 4.3V (a diode drop less than 5V). In addition, when a large number of pads are driven to 5V at the same time, such as when the 64 pads of a PCI bus are simultaneously driven high, the voltage on ESD plus ring 110 can spike up to 4.8V.

Due to the timing lag provided by RC timing circuit 210, the spike in voltage, a delta of 1.7V to 2.2V, causes the gate-to-source voltage of transistor M2 to again fall below the threshold voltage, thereby turning on transistor M2. When transistor M2 turns on, transistor M2 pulls up the voltage on the gate of transistor M1, thereby turning on transistor M1.

Since transistor M1 turned on in response to a 5V signal rather than in response to an ESD event, clamp 130 was falsely triggered. Falsely triggering clamp 130 increases power dissipation and significantly loads the external device that is driving the signal pad.

Thus, there is a need for a 5V tolerant corner clamp that does not falsely trigger when a 5V signal is driven onto a signal pad.

SUMMARY OF THE INVENTION

The present invention provides a 5V tolerant ESD corner clamp that does not falsely trigger when a 5V signal is driven onto a signal pad. A corner clamp in accordance with the present invention includes a clamp circuit that is connected to an electrostatic discharge (ESD) plus ring and an ESD minus ring.

The clamp circuit has a timing circuit that has a resistive element that is connected to the ESD plus ring and a first node. The clamp circuit also has a pre-driver circuit that is connected to the timing circuit. The pre-driver circuit includes a first transistor that is connected to the ESD plus ring. The first transistor turns on when a difference between a voltage on the ESD plus ring and a voltage on the first node exceeds a predetermined amount. The clamp circuit further has a switching circuit that is connected to the pre-driver circuit, the ESD plus ring, and the ESD minus ring.

The corner clamp of the present invention also includes a keep off circuit that is connected to the clamp circuit, the ESD plus ring, and the ESD minus ring. The keep off circuit has a control circuit that is connected to the first node. The control circuit has an output. In addition, the keep off circuit includes a keep off transistor that is connected to the ESD plus ring, the first node, and the output of the control circuit. The keep off transistor provides a current path from the ESD plus ring to the first node when turned on.

A better understanding of the features and advantages of the present invention will be obtained by reference to the following detailed description and accompanying drawings that set forth an illustrative embodiment in which the principles of the invention are utilized.

DETAILED DESCRIPTION

Figure 1:
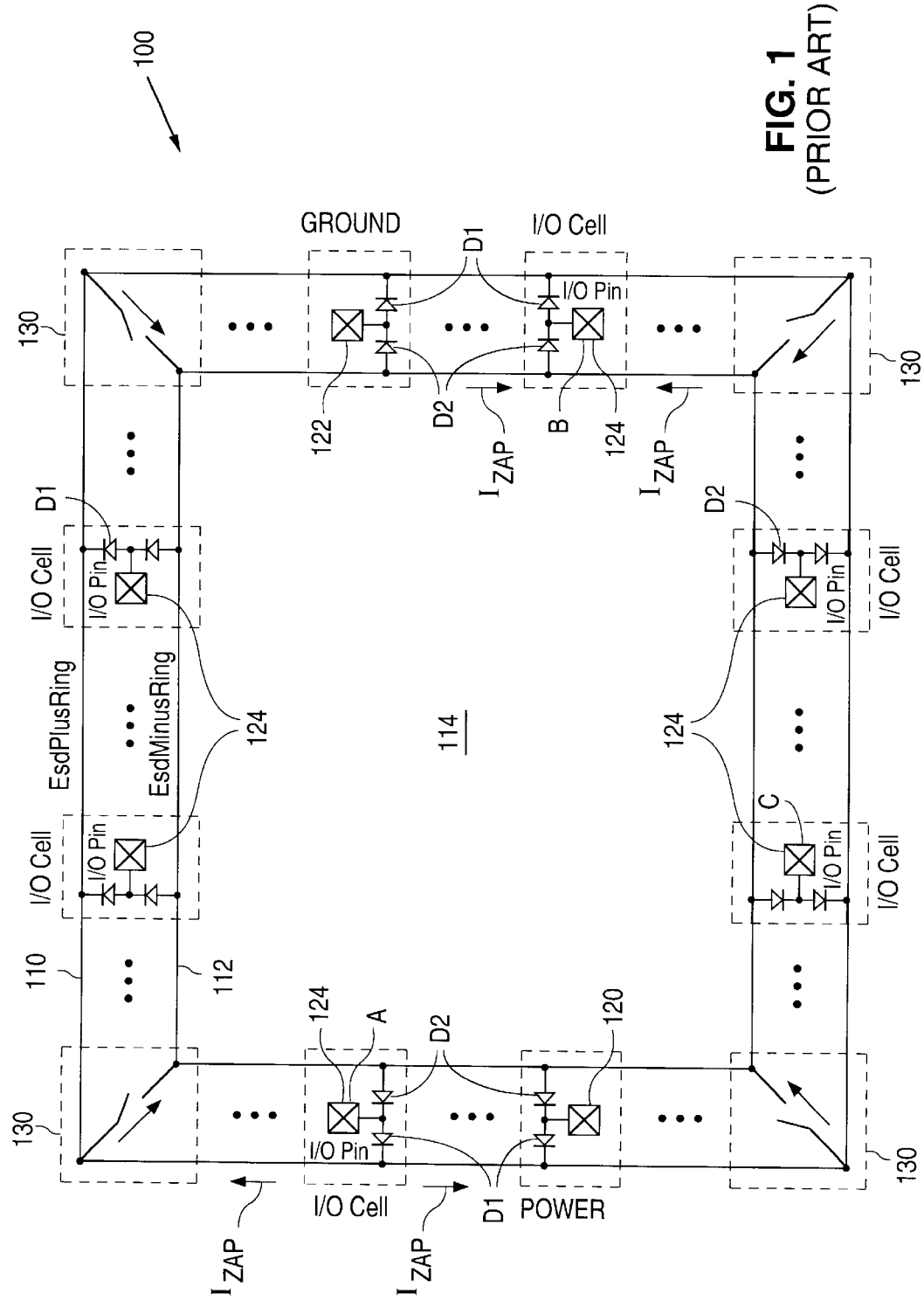
FIG. 1 is a schematic diagram illustrating a prior art ESD protection circuit 100.
Figure 2:
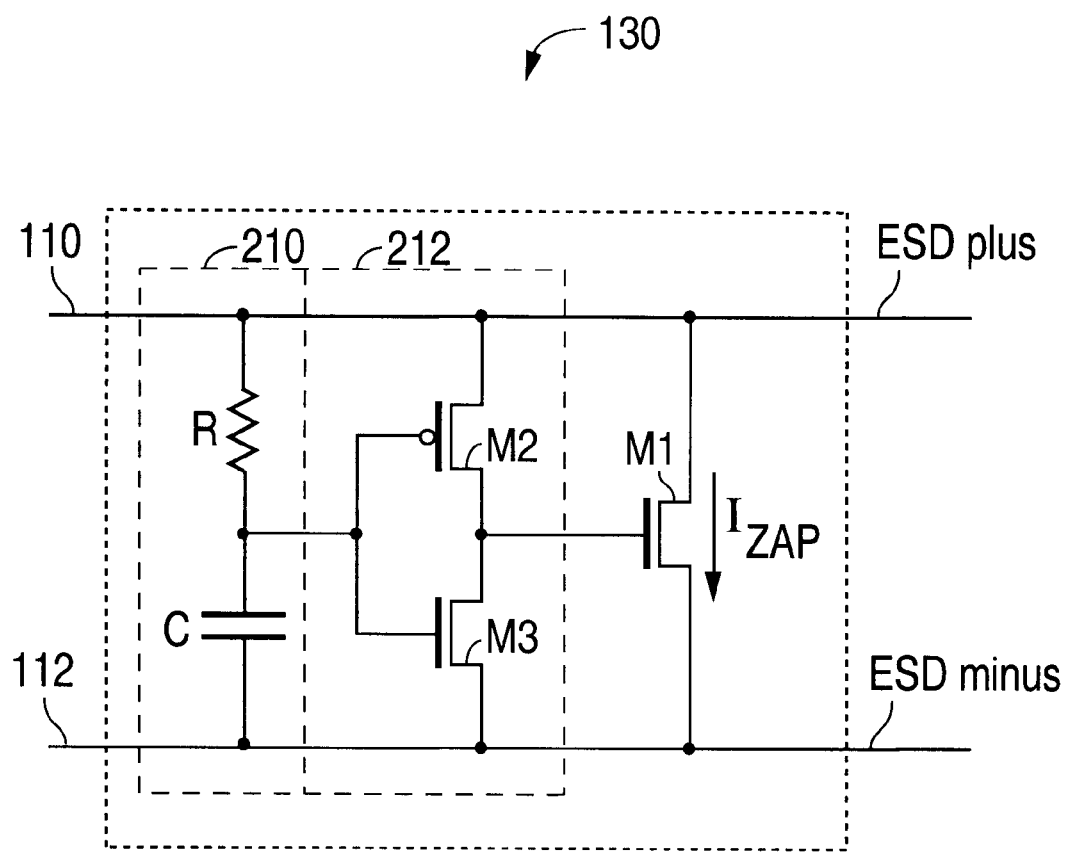
FIG. 2 is a schematic diagram illustrating a prior art corner clamp 130.
Figure 3A:
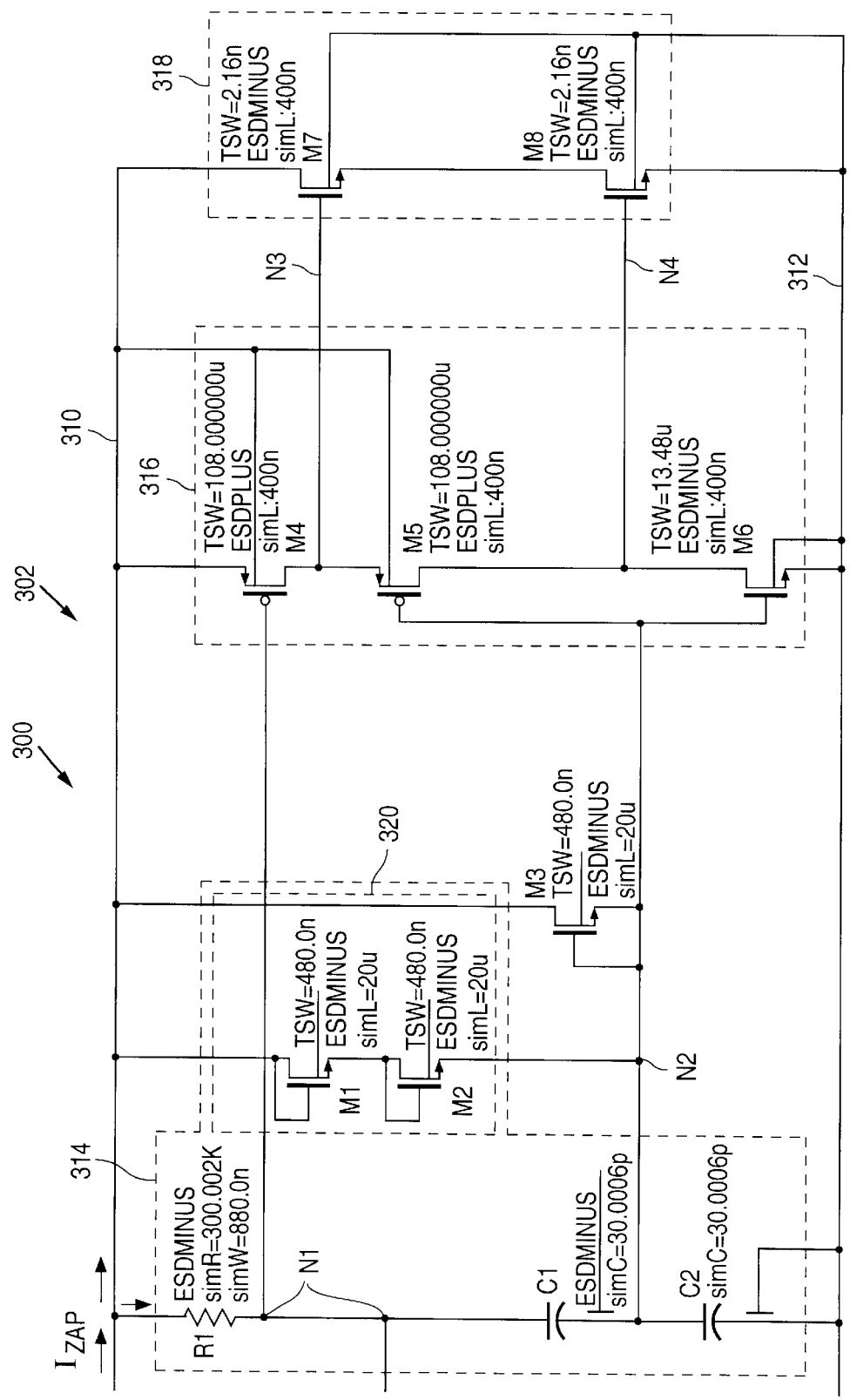
FIGS. 3A–3B are circuit diagrams illustrating a 5V tolerant corner clamp 300 in accordance with the present invention.
Figure 3B:
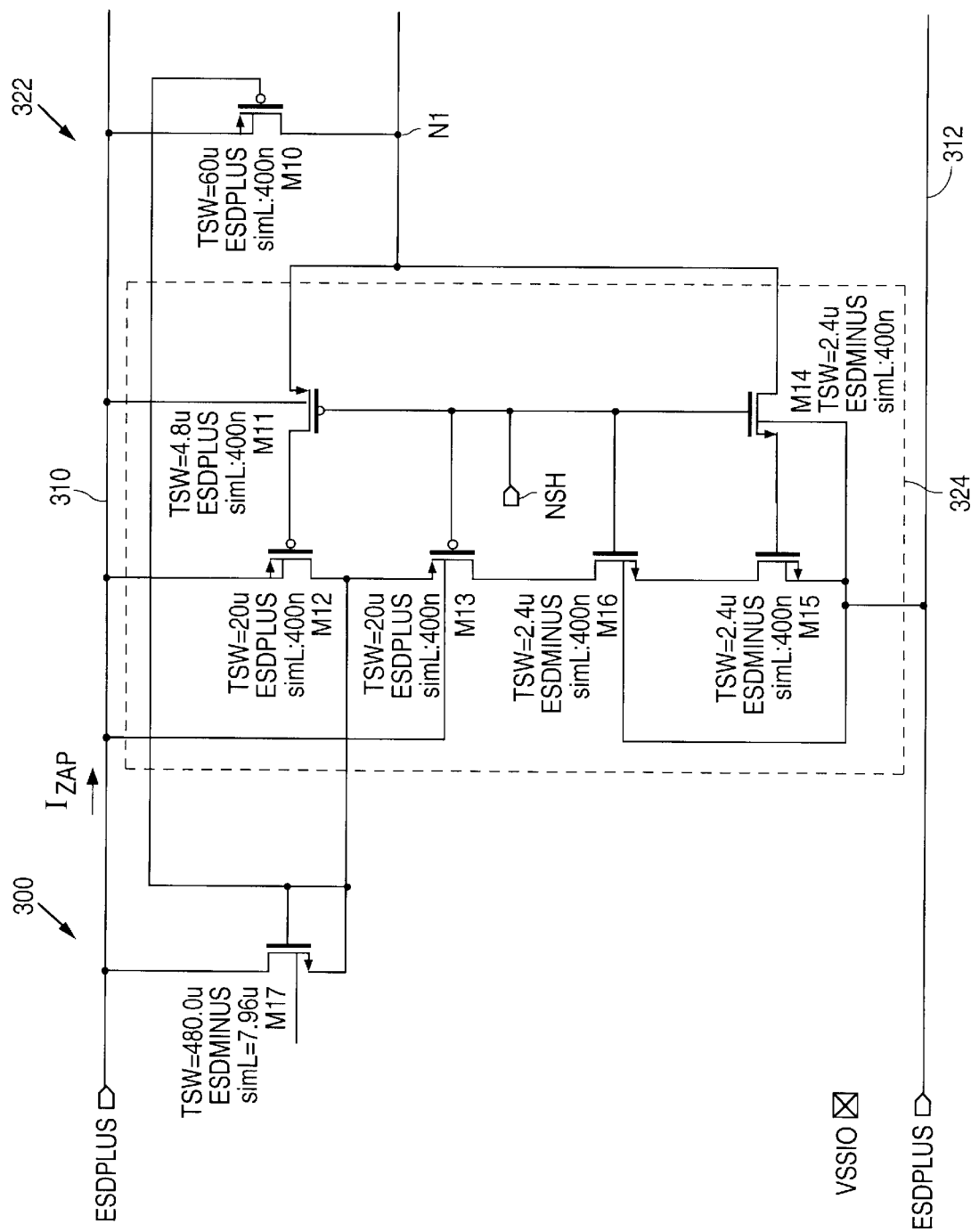

FIGS. 3A–3B show circuit diagrams that illustrate a 5V tolerant corner clamp 300 in accordance with the present invention. As described in greater detail below, clamp 300 provides 5V tolerance by utilizing a keep off circuit that prevents clamp 300 from triggering when the voltage on the positive rail spikes up in response to a 5V signal.

As shown in FIG. 3A, corner clamp 300 includes a clamp circuit 302 that provides a low impedance pathway from an ESD plus ring 310 to an ESD minus ring 312 when an ESD event occurs. In addition, clamp circuit 302 provides a high impedance pathway from ring 310 to ring 312 during normal operating conditions.

As further shown in FIG. 3A, clamp circuit 302 includes a RC timing circuit 314, a pre-driver circuit 316, and a switching circuit 318. RC timing circuit 314, in turn, includes a resistor R1, a first capacitor C1, and a second capacitor C2. Resistor R1 has a first end connected to ESD plus ring 310 and a second end connected to a first node N1.

Capacitor C1 has a first plate connected to the second end of resistor R1 and a second plate connected to a second node N2. Capacitor C2 has a first plate connected to the second plate of capacitor C1 and a second plate connected to ESD minus ring 312.

RC timing circuit 314 also includes a biasing circuit 320 and a reset transistor M3. Biasing circuit 320 is connected to ESD plus ring 310 and second node N2 to set the voltage on node N2. In the example shown in FIG. 3A, biasing circuit 320 is implemented with a pair of biasing transistors M1 and M2 that are configured are diodes, and thereby set the voltage on node N2 to be two diode drops less than the voltage on ESD plus ring 310. Reset transistor M3 has a drain connected to ESD plus ring 310, and a gate and source connected to second node N2.

Pre-driver circuit 316 includes a PMOS transistor M4, a PMOS transistor M5, and a NMOS transistor M6. Transistor M4 has a source connected to ESD plus ring 310, a gate connected to node N1, and a drain connected to a node N3. Transistor M5 has a source connected to the drain of transistor M4, a gate connected to node N2, and a drain connected to a node N4. Transistor M6 has a source connected to ESD minus ring 312, a gate connected to node N2, and a drain connected to a node N4.

Switching circuit 318 includes a NMOS transistor M7 that has a source, a gate connected to node N3, and a drain connected to ESD plus ring 310. Circuit 318 also includes a NMOS transistor M8 that has a source connected to ESD minus ring 312, a gate connected to node N4, and a drain connected to the source of transistor M7.

In operation, when an ESD event occurs and a zap current $I_{ZAP}$ flows onto ESD plus ring 310, the voltage on ESD plus ring 310 spikes up dramatically. The voltage on the gate of transistor M4 and the voltage on the gates of transistors M5 and M6 also spike up but, due to the presence of RC timing circuit 314, the two gate voltages lag the voltage on ESD plus ring 310.

As a result, the gate-to-source voltage of transistor M4 falls below the threshold voltage of transistor M4, thereby turning on transistor M4 for as long as the voltage on the gate of transistor M4 lags the voltage on ring 310. When transistor M4 turns on, transistor M4 pulls up the voltage on the source of transistor M5 and the gate of transistor M7, thereby turning on transistor M7.

In addition, the voltage on the source of transistor M5 rises faster than the voltage on the gate of transistor M5, thereby turning on transistor M5. When transistor M5 turns on, the voltage on node N6 rises, thereby turning on transistor M8. When transistors M7 and M8 are turned on, clamp circuit 302 provides a low impedance pathway from ESD plus ring 310 to ESD minus ring 312.

Following an ESD event (or when the voltage on a pin is rapidly cycled ON/OFF/ON), a large charge is present on node N2. In this case, transistor M3 turns on and provides a discharge path when ESD plus ring 310 is grounded. When charge is left on node N2, transistor M6 is left turned on. If a subsequent ESD event occurs and transistor M6 is turned on, the device will fail.

Clamp 300 is included in a packaged integrated circuit that is attached to a circuit board. When power has been applied to the integrated circuit and a steady state condition has been reached, a first voltage is present on both ESD plus ring 310 and the gate of transistor M4. For example, when ESD plus ring 310 is connected to a 3.3V power pad via a forward biased diode, 2.6V is present on ESD plus ring 310 and the gate of transistor M4. When the voltage on the source and gate of transistor M4 is equal to the first voltage, transistor M4 is turned off.

In addition, a second voltage that is sufficient to turn on transistor M6 is present on the gates of transistors M5 and M6. In the example shown in FIG. 3A, the second voltage, which is defined by transistors M1 and M2, is two diode drops below the first voltage. When turned on, transistor M6 pulls down the voltage on the gate of transistor M8, thereby turning off transistor M8.

When transistor M8 is turned off, clamp circuit 302 provides a high impedance pathway from ESD plus ring 310 to ESD minus ring 312. In addition, transistor M6 also pulls down the voltage on node N3 to be a diode drop greater than the voltage on node N2, thereby turning off transistor M5.

Further, a third voltage is present on ESD minus ring 312. For example, when ESD minus ring 312 is connected to a ground pad via a forward biased diode, 0.7V is present on ESD minus ring 312 due to the diode drop.

As shown in FIG. 3B, in accordance with the present invention, clamp 300 also includes a keep off circuit 322 that prevents clamp circuit 302 from falsely triggering when a 5V signal is driven onto a signal pad. Keep off circuit 322, in turn, includes a keep off transistor M10, and a control circuit 324 that is connected to keep off transistor M10. Transistor M10 has a drain connected to node N1, a gate connected to control circuit 324, and a source connected to ESD plus ring 310.

Control circuit 324 includes PMOS transistors M11, M12, and M13, and NMOS transistors M14, M15, and M16. PMOS transistor M11 has a source connected to node N1, a gate connected to a shield node NSH, and a drain. PMOS transistor M12 has a source connected to ESD plus ring 310, a gate connected to the drain of transistor M11, and a drain. PMOS transistor M13 has a source connected to the drain of transistor M12 and the gate of transistor M10, a gate connected to the shield node NSH, and a drain.

NMOS transistor M14 has a source, a gate connected to the shield node NSH, and a drain connected to node N1. NMOS transistor M15 has a source connected to ESD minus ring 312, a gate connected to the source of transistor M14, and a drain. NMOS transistor M16 has a source connected to the drain of transistor M15, a gate connected to the shield node NSH, and a drain connected to the drain of transistor M13.

In addition, keep off circuit 322 also includes a NMOS reset transistor M17 that has a drain connected to ESD plus ring 310, and a gate and a source connected to the source of transistor M13. Transistor M17, which is normally off, provides a leakage path to discharge the source of transistor M13 to ESD plus ring 310 when ring 310 is grounded. Transistor M17 helps reset keep off circuit 322 when the voltage connected to any pin on the chip is rapidly cycled ON/OFF/ON.

In operation, when an ESD event occurs and a zap current $I_{ZAP}$ flows onto ESD plus ring 310, the voltage on ESD plus ring 310 spikes up dramatically. The rising voltage on the source of transistor M12 causes transistor M12 to turn on. When transistor M12 turns on, the voltage on the source of transistor M13 and the gate of transistor M10 rises. Since transistor M10 has the same gate and source voltages, transistor M10 is turned off during an ESD event. As a result, clamp circuit 302 works during an ESD event as described above.

As further described above, when clamp 300 has been included in a packaged integrated circuit that is attached to a circuit board, power has been applied, and a steady state condition has been reached, the first voltage is present on both ESD plus ring 310 and node N1. In addition, a shield voltage of approximately ½ the voltage on ESD plus ring 310 is applied to the shield node NSH. For example, with an ESD ring voltage of 2.6V, a 1.3V shield voltage is utilized.

In this condition, the voltages on node N1 and the shield node NSH are sufficient to turn on transistor M11 which, in turn, increases the voltage on the gate of transistor M12, thereby turning transistor M12 off. The voltages on node N1 and the shield node NSH are also sufficient to turn on transistor M14 enough to pull up the voltage on the source of transistor M14 to be a diode drop below the shield voltage on the shield node NSH.

A voltage that is a diode drop below the shield voltage is sufficient to turn on transistor M15 which, in turn, pulls down the voltage on the source of transistor M16, thereby turning on transistor M16. When transistor M16 turns on, the voltage on the drain of transistor M13 is also pulled low which, in turn, pulls the voltage on the source of transistor M13 to a diode drop above the shield voltage on the shield node NSH.

Thus, the voltage on the source of transistor M13 and the gate of transistor M10 is a diode drop above the shield voltage. When the voltage on the gate of transistor M10 is a diode drop above the shield voltage and the source of transistor M10 is equal to the first voltage, transistor M10 is turned on, thereby shorting ESD plus ring 310 to node N1.

In accordance with the present invention, when a 5V signal is driven onto a signal pad and ESD plus ring 310 spikes up to 4.3V (or 4.8V), the voltage on node N1 immediately follows the spike on ESD plus ring 310. This is because transistor M10 conducts enough current to prevent the voltage on node N1 from falling more than a diode drop below the voltage on ESD plus ring 310 when the voltage on ring 310 rises from 2.6V to 4.3V (or 4.8V).

As a result, the gate-to-source voltage of transistor M4 is not able to fall below the threshold voltage of transistor M4. This keeps transistor M4 from turning on which, in turn, prevents clamp 300 from false triggering.

When power is first applied to clamp 300, switching transistor M10 does not turn on until the voltage on node N1 has risen to just below the first voltage on ESD plus ring 310. When the power is initially applied to clamp 300, the rising voltage on ESD plus ring 310 (the source of transistor M12) causes transistor M12 to turn on. When transistor M12 turns on, the voltage on the source of transistor M13 and the gate of transistor M10 rises. Since transistor M10 has the same gate and source voltages, transistor M10 is turned off.

However, once the voltage on node N1 rises to a value that is a diode drop above the shield voltage, transistor M11 turns on. When the voltage on node N1 reaches a diode drop less than the voltage on ESD plus ring 310 transistor M12 turns off. At the same time, transistors M14, M15, and M16 are turned on.

Thus, when transistor M12 turns off, transistors M15 and M16 pull the voltage on the source of transistor M13 down to a diode drop above the shield voltage, thereby turning on transistor M10. In the example shown in FIGS. 3A–3B, the transistor ratio of transistors M12/M13 and M15/M16 is 8.33:1. This allows transistor M12 to quickly charge up the gate of transistor M10, and transistors M15 and M16 to slowly pull down the voltage on the gate of transistor M10 to a diode drop above the shield voltage. Thus, transistor M10 turns on at a relatively high voltage to avoid interaction with the intended ESD function.

Figure 4A:
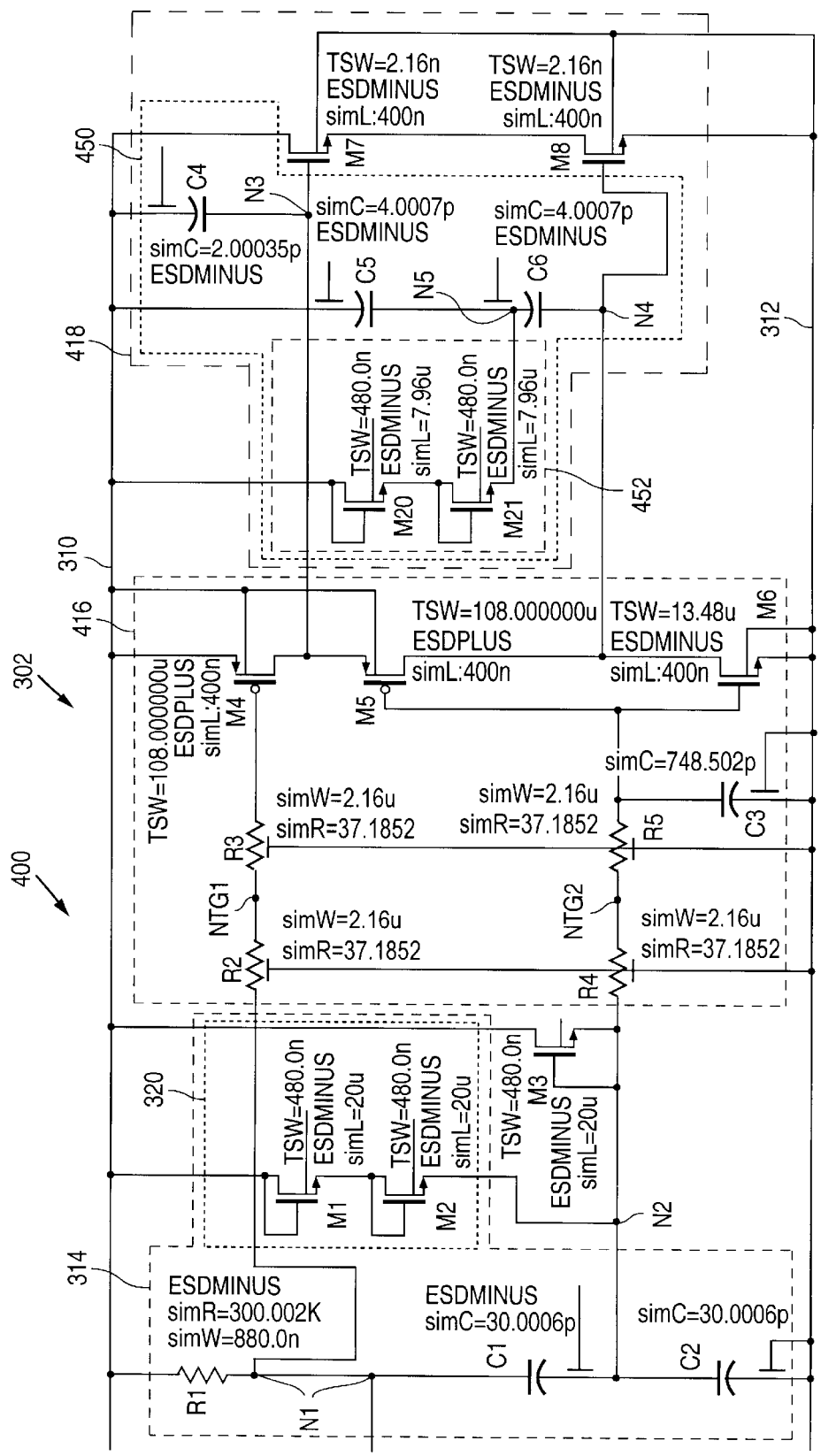
FIGS. 4A–4B are circuit diagrams illustrating a 5V tolerant corner clamp 400 in accordance with an alternate embodiment of the present invention.
Figure 4B:
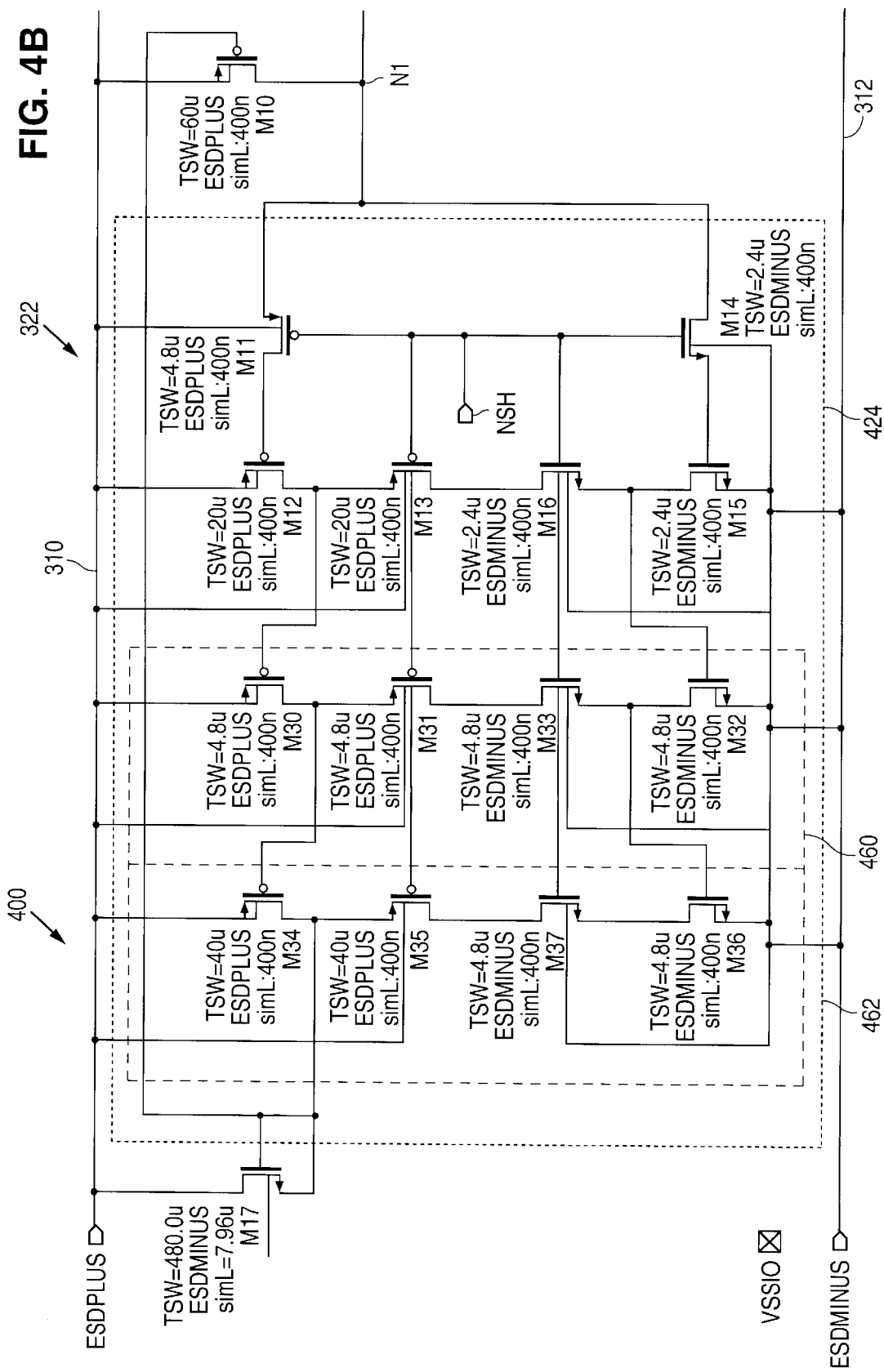

FIGS. 4A–4B show circuit diagrams that illustrate a 5V tolerant corner clamp 400 in accordance with an alternate embodiment of the present invention. Clamp 400 is similar to clamp 300 and, as a result, utilizes the same reference numerals to designate the structures which are common to both clamps.

As shown in FIG. 4A, clamp 400 differs from clamp 300 in that clamp 400 includes a pre-driver circuit 416. Pre-driver circuit 416 is the same as pre-driver circuit 316 except that circuit 416 includes resistors R2, R3, R4, and R5. Resistors R2–R5 act as antenna diodes that are utilized to prevent a charge from accumulating on nodes N1 and N2 during the fabrication of clamp 400.

Resistor R2 has a first end connected to node N1 and a second end connected to a first trigger node NTG1. Resistor R3 has a first end connected to trigger node NTG1 and a second end connected to the gate of transistor M4.

Similarly, resistor R4 has a first end connected to node N2 and a second end connected to a second trigger node NTG2. Resistor R5 has a first end connected to trigger node NTG2 and a second end connected to the gates of transistors M5 and M6.

In addition, pre-driver circuit 416 includes a capacitor C3 that has a first plate connected to the gates of transistors M5 and M6 and a second plate connected to ESD minus ring 312. During an ESD event, the Miller capacitance of transistor M5 pulls up the voltage on the gates of transistors M5 and M6 as the voltage on the source of transistor M5 increases.

This is an undesirable condition because if transistor M6 turns on during an ESD event, clamp 300 will fail. Although capacitor C2 limits the ability of transistor M6 to turn on as a result of Miller capacitance, capacitor C3 insures that transistor M6 does not turn on during an ESD event.

As further shown in FIG. 4A, clamp 400 also differs from clamp 300 in that clamp 400 includes a switching circuit 418. Switching circuit 418 is the same as switching circuit 318 except that switching circuit 418 includes a speed up circuit 450. Speed up circuit 450, in turn, includes a capacitor C4, a capacitor C5, a capacitor C6, and a biasing circuit 452.

Capacitor C4 has a first plate connected to ESD plus ring 310 and a second plate connected to node N3. Capacitor C5 has a first plate connected to ESD plus ring 310 and a second plate connected to a node N5. Capacitor C6 has a first plate connected to node N5 and a second plate connected to node N4.

Biasing circuit 452, in turn, sets the voltage on node N5. In the example shown in FIG. 4A, biasing circuit 452 is implemented with a pair of biasing transistors M20 and M21 that are configured as diodes, and thereby set the voltage on node N5 to be two diode drops less than the voltage on ESD plus ring 310.

In operation, capacitors C4, C5, and C6 store a charge that reduces the additional charge that is required to turn on transistors M7 and M8. As a result, less time is required to turn on transistors M7 and M8 after transistors M4 and M5 turn on and conduct.

As shown in FIG. 4B, clamp 400 differs from clamp 300 in that clamp 400 includes a control circuit 424. Control circuit 424 is the same as control circuit 324 except that circuit 424 includes a first inverter 460 and a second inverter 462. Inverter 460 includes a PMOS transistor M30, a PMOS transistor M31, a NMOS transistor M32, and a NMOS transistor M33.

PMOS transistor M30 has a source connected to ESD plus ring 310, a gate connected to the source of transistor M13, and a drain. PMOS transistor M31 has a source connected to the drain of transistor M30, a gate connected to the shield node NSH, and a drain.

NMOS transistor M32 has a source connected to ESD minus ring 312, a gate connected to the source of transistor M16, and a drain. NMOS transistor M33 has a source connected to the drain of transistor M15, a gate connected to the shield node NSH, and a drain connected to the drain of transistor M31.

Inverter 462 includes a PMOS transistor M34, a PMOS transistor M35, a NMOS transistor M36, and a NMOS transistor M37. PMOS transistor M34 has a source connected to ESD plus ring 310, a gate connected to the drain of transistor M30, and a drain. PMOS transistor M35 has a source connected to the drain of transistor M34, a gate connected to the shield node NSH, and a drain.

NMOS transistor M36 has a source connected to ESD minus ring 312, a gate connected to the source of transistor M33, and a drain. NMOS transistor M37 has a source connected to the drain of transistor M36, a gate connected to the shield node NSH, and a drain connected to the drain of transistor M35.

In operation, inverters 460 and 462 function as a buffer. As a result, the voltage on the drain of transistor M34 is the same as the voltage on the drain of transistor M12. However, unlike the voltage on the drain of transistor M12, the voltage on the drain of transistor M34 has a very small and well defined rise time. When the drain of transistor M12 drives the voltage on the gate of transistor M10, the voltage on the gate of transistor M10 turns on transistor M10 sooner.

It should be understood that various alternatives to the method of the invention described herein may be employed in practicing the invention. Thus, it is intended that the following claims define the scope of the invention and that methods and structures within the scope of these claims and their equivalents be covered thereby.

What is claimed is:

1. A corner clamp comprising:
   a clamp circuit connected to an electrostatic discharge (ESD) plus ring and an ESD minus ring, the clamp circuit having:
   a timing circuit, the timing circuit having a resistive element connected to the ESD plus ring and a first node;
   a pre-driver circuit connected to the timing circuit, the pre-driver circuit including a first transistor connected to the ESD plus ring, the first transistor turning on when a difference between a voltage on the ESD plus ring and a voltage on the first node exceeds a predetermined amount; and
   a switching circuit connected to the pre-driver circuit, the ESD plus ring, and the ESD minus ring; and
   a keep off circuit connected to the clamp circuit, the keep off circuit having:
   a control circuit connected to the first node and a shield node, the control circuit having an output; and
   a keep off transistor connected to the ESD plus ring, the first node, and the output of the control circuit, the keep off transistor providing a current path from the ESD plus ring to the first node when turned on.

2. The corner clamp of claim 1 wherein:
   the ESD plus ring has a steady first voltage, and can be driven to a larger second voltage, and
   the keep off transistor sources a current into the first node when the voltage on the ESD plus ring changes from the first voltage to the second voltage, the current having a magnitude that prevents the difference from exceeding the predetermined amount.

3. The corner clamp of claim 2 wherein when a voltage on the ESD plus ring spikes up to a third voltage that is substantially greater than the second voltage, the keep off transistor is turned off.

4. The corner clamp of claim 1 wherein the control circuit includes:
   a PMOS transistor having a source connected to the first node and a gate connected to the shield node; and
   a NMOS transistor having a drain connected to the first node and a gate connected to the shield node.

5. The corner clamp of claim 4 wherein the control circuit further includes an output transistor connected to the shield node and the keep off transistor.

6. The corner clamp of claim 1 wherein the control circuit includes an inverter connected to the ESD plus ring, the ESD minus ring, and the shield node, the inverter having an output transistor that is connected to the shield node and the keep off transistor.

7. The corner clamp of claim 6 wherein the output transistor has a gate connected to the shield node.

8. The corner clamp of claim 6 and further comprising a reset transistor connected to the ESD plus ring and the keep off transistor.

9. The corner clamp of claim 8 wherein the output transistor has a source that is connected to the reset transistor.

10. The corner clamp of claim 1 wherein the clamp circuit includes:
    a second transistor connected to the ESD minus ring; and
    a capacitor connected to the ESD minus ring and the second transistor.

11. The corner clamp of claim 10 wherein the clamp circuit further includes a third transistor connected to the first transistor and the second transistor.

12. The corner clamp of claim 11 wherein the clamp circuit includes:
    a first capacitive element connected to the resistive element;
    a second capacitive element connected to the first capacitive element and the ESD minus ring, and
    a bias circuit connected to the ESD plus ring and the first and second capacitive elements.

13. The corner clamp of claim 12 wherein the switching circuit includes:
    a fourth transistor connected to the ESD plus ring and the first transistor; and
    a fifth output transistor connected to the ESD minus ring, the second transistor, the third transistor, and the fourth transistor.

14. A corner clamp comprising:
    a clamp circuit connected to an electrostatic discharge (ESD) plus ring and an ESD minus ring, the clamp circuit having:
      a timing circuit having:
        a first resistive element connected to the ESD plus ring and a first node;
        a first capacitive element connected to the first node;
        a second capacitive element connected to the first capacitive element and the ESD minus ring; and
        a bias circuit connected to the ESD plus ring and the first and second capacitive elements; and
      a pre-driver circuit connected to the timing circuit, the pre-driver circuit including a first transistor connected to the ESD plus ring, the first transistor turning on when a difference between a voltage on the ESD plus ring and a voltage on the first node exceeds a predetermined amount; and
      a switching circuit connected to the pre-driver circuit, the ESD plus ring, and the ESD minus ring.

15. The corner clamp of claim 14 wherein the pre-driver circuit includes:
    a second transistor that has a source connected to a drain of the first transistor, a gate, and a drain; and
    a third transistor that has a source connected to the ESD minus ring, a gate connected to the gate of the second transistor, a drain connected to the drain of the second transistor.

16. The corner clamp of claim 15 wherein the switching circuit includes:
    a fourth transistor connected to the ESD plus ring and the first transistor; and
    a fifth transistor connected to the ESD minus ring, the drain of the second transistor, and the fourth transistor.

17. The corner clamp of claim 14 wherein the pre-driver circuit includes:
    a second transistor connected to the ESD minus ring; and
    a capacitor connected to the ESD minus ring and the second transistor.

18. The corner clamp of claim 16 wherein the pre-driver circuit includes:
    a third capacitive element connected to the ESD plus ring;
    a fourth capacitive element connected to the third capacitive element and the fourth transistor, and
    a bias circuit connected to the ESD plus ring and the third and fourth capacitive elements.

* * * * *